United States Patent
Hsu

(10) Patent No.: US 8,329,517 B2
(45) Date of Patent: Dec. 11, 2012

(54) PIXEL STRUCTURE AND METHOD FOR MANUFACTURING THE SAME

(75) Inventor: Po-Ching Hsu, Miao-Li (TW)

(73) Assignee: Chimei Innolux Corporation, Miao-Li County (TW)

(*) Notice: Subject to any disclaimer, the term of this patent is extended or adjusted under 35 U.S.C. 154(b) by 156 days.

(21) Appl. No.: 12/873,271

(22) Filed: Aug. 31, 2010

(65) Prior Publication Data
US 2011/0068333 A1    Mar. 24, 2011

(51) Int. Cl.
*H01L 21/00* (2006.01)
(52) U.S. Cl. ............ 438/149; 438/151; 257/E29.273; 257/E21.7
(58) Field of Classification Search .......... 438/149, 438/151; 257/E29.273, E21.7
See application file for complete search history.

(56) References Cited

U.S. PATENT DOCUMENTS
7,977,151 B2 * 7/2011 Shieh et al. ............ 438/104

* cited by examiner

*Primary Examiner* — Minh-Loan T Tran
(74) *Attorney, Agent, or Firm* — WPAT PC; Justin King

(57) ABSTRACT

A method for manufacturing a pixel structure includes providing a substrate including a transistor region and a pixel region, forming at least one gate electrode on the transistor region, forming an insulating layer on the substrate to overlay the gate electrode, and forming a patterned semi-conductive layer on the surface of a portion of the insulating layer disposed on the transistor region and the pixel region. A patterned first protective layer is formed on a portion of the patterned semi-conductive layer corresponding to the gate electrode, and the patterned semi-conductive layer is doped without being overlaid by the patterned first protective layer.

6 Claims, 8 Drawing Sheets

US 8,329,517 B2

PIXEL STRUCTURE AND METHOD FOR MANUFACTURING THE SAME

BACKGROUND

1. Technical Field

The disclosure generally relates to pixel structures, and particularly to a pixel structure with a doped semi-conductive material and method for manufacturing the pixel structure.

2. Description of Related Art

Since LCDs are thin and light, they consume relatively little electrical power and emit less radiation than other display types. A LCD panel usually includes a plurality of thin film transistors (TFTs) substrates, a color filter substrate, and liquid crystal molecule layer sandwiched between the plurality of substrates. The TFT substrate includes a plurality of pixels. Each pixel is defined with a plurality of parallel scan lines and a plurality of parallel data lines perpendicular to the scan lines and uses a TFT as a switch. The liquid crystal molecules are driven by a pixel electrode to adjust the brightness. Meanwhile, the pixels generate red, green, and blue light beams with different brightness corresponding to red, green, and blue color filters of the color filter substrate, and finally high quality colorful images are displayed.

A TFT usually includes a gate electrode, a source electrode, a drain electrode, and an amorphous silicon layer served as a channel. With the development toward larger sizes, higher resolution and lower dynamic blur of displays, the TFT made of amorphous silicon cannot meet the requirements with aspects of conductivity, stability, low leakage, and transmittance. The pixel electrode of the TFT is usually made of transparent material such as indium-tin oxide (ITO). In addition, a conventional method for manufacturing a pixel structure may include more than five mask processes to define members such as a gate electrode, a source electrode, a drain electrode, a channel, a pixel electrode, which increases the cost of the LCD display.

Therefore, there is room for improvement within the art.

SUMMARY OF THE DISCLOSURE

A method for manufacturing a pixel structure includes the following steps: providing a substrate including a transistor region and a pixel region; forming at least one gate electrode on the transistor region of the substrate; forming an insulating layer on the substrate to overlay the gate electrode; forming a patterned semi-conductive layer located on the transistor region and the pixel region of the surface of the insulating layer; forming a patterned first protective layer on a portion of the patterned semi-conductive layer corresponding to the gate electrode; and doping the patterned semi-conductive layer without being overlaid by the patterned first protective layer. The doped semi-conductive layer serves as a source electrode and a pixel electrode, and the patterned semi-conductive layer overlaid by the patterned first protective layer serves as a channel between the source electrode and the pixel electrode.

Other advantages and novel features will become more apparent from the following detailed description when taken in conjunction with the accompanying drawings.

BRIEF DESCRIPTION OF THE DRAWINGS

Many aspects of the pixel structure and method for manufacturing the same can be better understood with reference to the following drawings. The components in the drawings are not necessarily drawn to scale, the emphasis instead being placed upon clearly illustrating the principles of the pixel structure and method for manufacturing the same.

DETAILED DESCRIPTION

Figure 1:
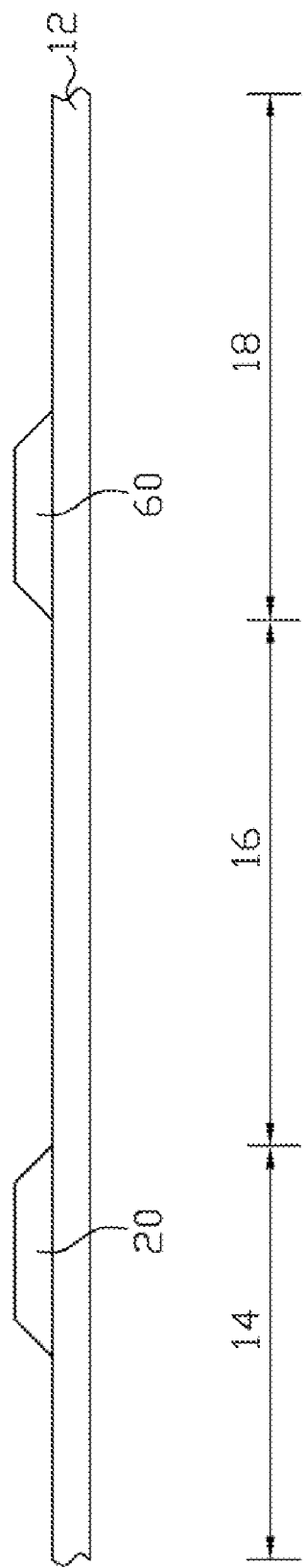
FIGS. 1-5 are schematic views illustrating steps of a process of manufacturing a pixel structure, according to one exemplary embodiment.

A method for manufacturing a pixel structure according to an exemplary embodiment of the present disclosure may include following steps:

Referring to FIG. 1, providing a substrate 12 made of organic or inorganic material such as glass, quartz, plastic, resin, acryl, for example. The substrate 12 includes a transistor region 14, a pixel region 16, and a conductor region 18. A plurality of gate electrodes 20 and a plurality of conductive patterns 60 are respectively formed on the transistor region 14 and the conductor region 18 of the substrate 12.

A process of forming the gate electrodes 20 and the conductive patterns 60 may include the following steps: forming a conductive material layer (not shown) made of metal such as tungsten, molybdenum, tungsten and molybdenum alloys, aluminum and molybdenum alloys, and aluminum and titanium alloys, on the substrate 12. A portion of the conductive material layer is removed to form a plurality of scan lines (not shown) and a plurality of gate electrodes 20 and conductive patterns 60 of a TFT on the substrate 12 by a photo-etching process.

Figure 2:
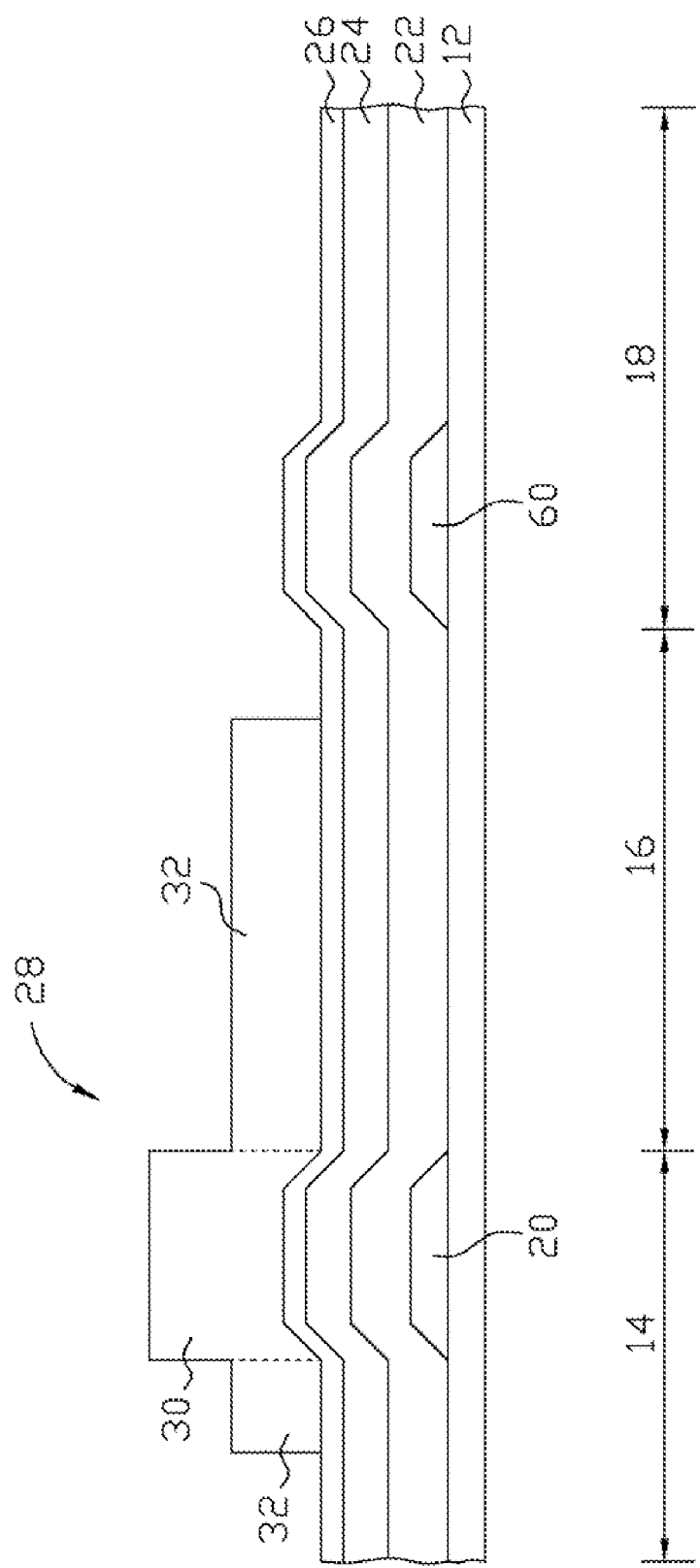
Figure 3:
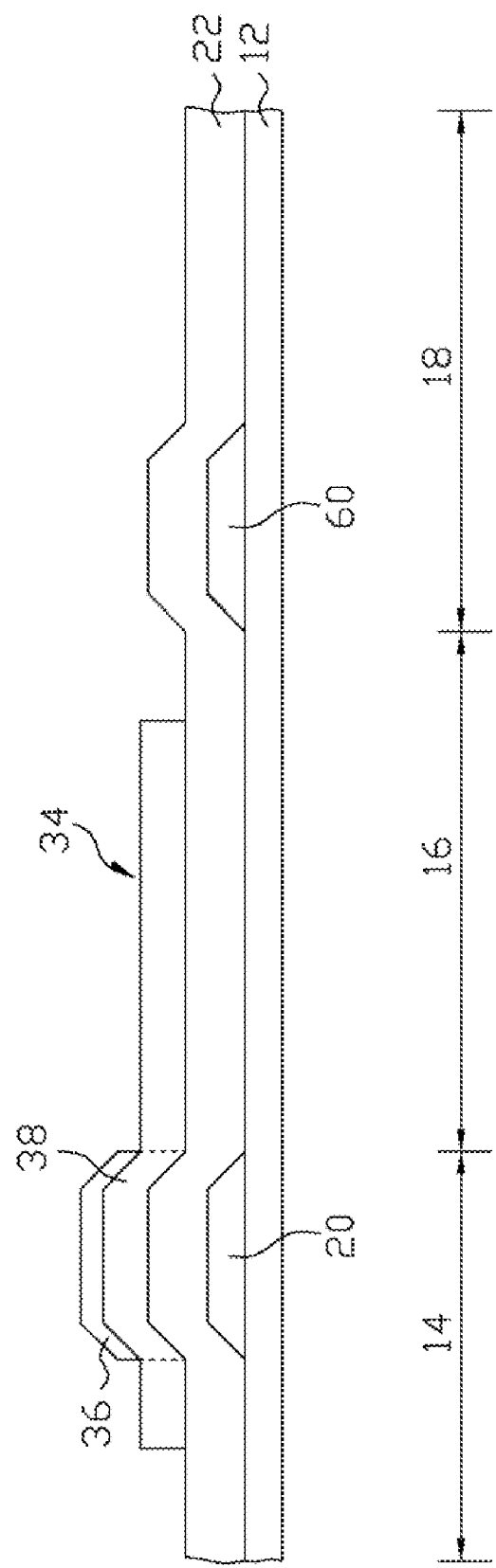

Referring to FIGS. 2 and 3, an insulating layer 22 used as a gate insulating layer of the TFT is formed on the substrate 12 to overlay the gate electrodes 20 and conductive patterns 60. In this exemplary embodiment, the insulating layer 22 is made of monox. Then, a transparent semi-conductive layer 24 and a first protective layer 26 are deposited on the insulating layer 22 sequentially. A patterned semi-conductive layer 34 and a patterned protective layer 36 (FIG. 3) are formed on the insulating layer 22 by a patterning process. The semi-conductive layer 24 is made of indium gallium zinc oxide (InGaZnO). The first protective layer 26 is made of monox.

A process of forming the patterned semi-conductive layer 34 and the first protective layer 36 includes following steps:

A first patterned photo-resist layer 28 having different thickness is formed on the first protective layer 26 by a half-tone mask (not shown). The first patterned photo-resist layer 28 includes a first portion 30 corresponding to the gate electrode 20 of the transistor region 14, a second portion 32 corresponding to a preset position of a source/drain electrode (not shown) of the pixel region 16 and the transistor region 14. The thickness of the first portion 30 is thicker than that of the second portion 32.

The first protective layer 26 and the semi-conductive layer 24 outside of the transistor region 14 and the pixel region 16 is removed, and the remaining semi-conductive layer 24 forms the patterned semi-conductive layer 34 (shown in FIG. 4) with the first patterned photo-resist layer 28 by an etching process, such as a dry etching process or a wet etching process. The thickness of the first portion 30 of the first patterned photo resist layer 28 is anisotropically decreased by an ashing process, removing the second portion 32 of the first patterned photo-resist layer 28, that is disposed on the transistor region 14 and the pixel region 16. Thus, the thickness of the first portion 30 of the first patterned photo-resist layer 28 is decreased.

The first protective layer 26 outside of the transistor region 14 is removed to form the patterned first protective layer 36 (shown in FIG. 4) by using the first portion 30 of the first patterned photo-resist layer 28 disposed on the transistor region 14 as an etching shield. A channel region 38 is defined in the patterned semi-conductive layer 34 with the patterned first protective layer 36. The remaining first patterned photo-resist layer 28 is completely removed.

In this embodiment, the first patterned photo-resist layer 28 is formed by using a half-tone mask, and the patterned semi-conductive layer 34 and patterned first protective layer 36 is formed from the first patterned photo-resist layer 28 with a patterning process. That is only one half-tone mask process is needed to pattern the semi-conductive layer 24 and the first protective layer 26 and form the patterned semi-conductive layer 34 and the patterned first protective layer 36. However, in other embodiments, the conventional two-mask process can also form the patterned semi-conductive layer 34, and the patterned first protective layer 36.

Figure 4:
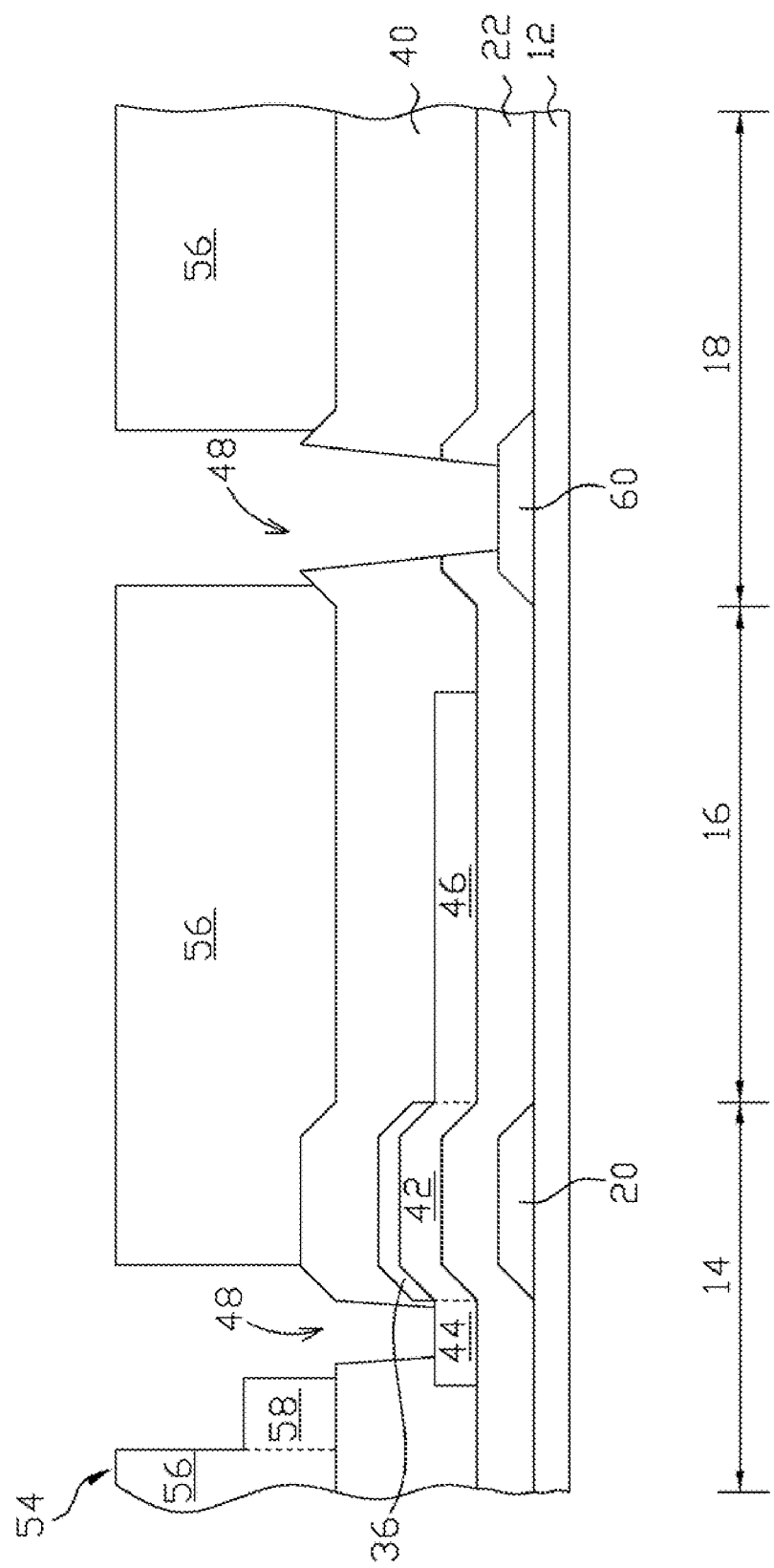

Referring to FIG. 4, subsequently, forming a second protective layer 40 on the substrate 12 to overlay the first patterned protective layer 36, the patterned semi-conductive layer 34 and the insulating layer 22 with a chemical vapor deposition (CVD) process. The second protective layer 40 includes silicon nitride. In this embodiment, gas having hydrogen atoms is imported during the CVD process, and the hydrogen atoms are implanted into the patterned semi-conductive 34 without being overlaid by the first patterned protective layer 36 to form a doped semi-conductive layer.

In this embodiment, the patterned semi-conductive layer 34 overlaid by the first patterned protective layer 36, without being doped to serve as a channel 42 of a TFT. The patterned semi-conductive layer 34 without being overlaid by the first patterned protective layer 36 or doped in the CVD process is served as a source electrode 44 and a pixel electrode 46 of the TFT. That is the channel 42, the source electrode 44, and the pixel electrode 46 can be simultaneously formed from the patterned semi-conductive layer 34 in the CVD process of the second protective layer 40, by using the patterned first protective layer 36 as a shield. In other embodiments, by using the shield of the patterned first protective layer 36, the patterned semi-conductive layer 34 without being overlaid by the first patterned protective layer 36 can be doped first to form the source electrode 44, and the pixel electrode 46, by an ion implantation process or high concentrations of plasma doping process. The second protective layer 40 is deposited.

Figure 5:
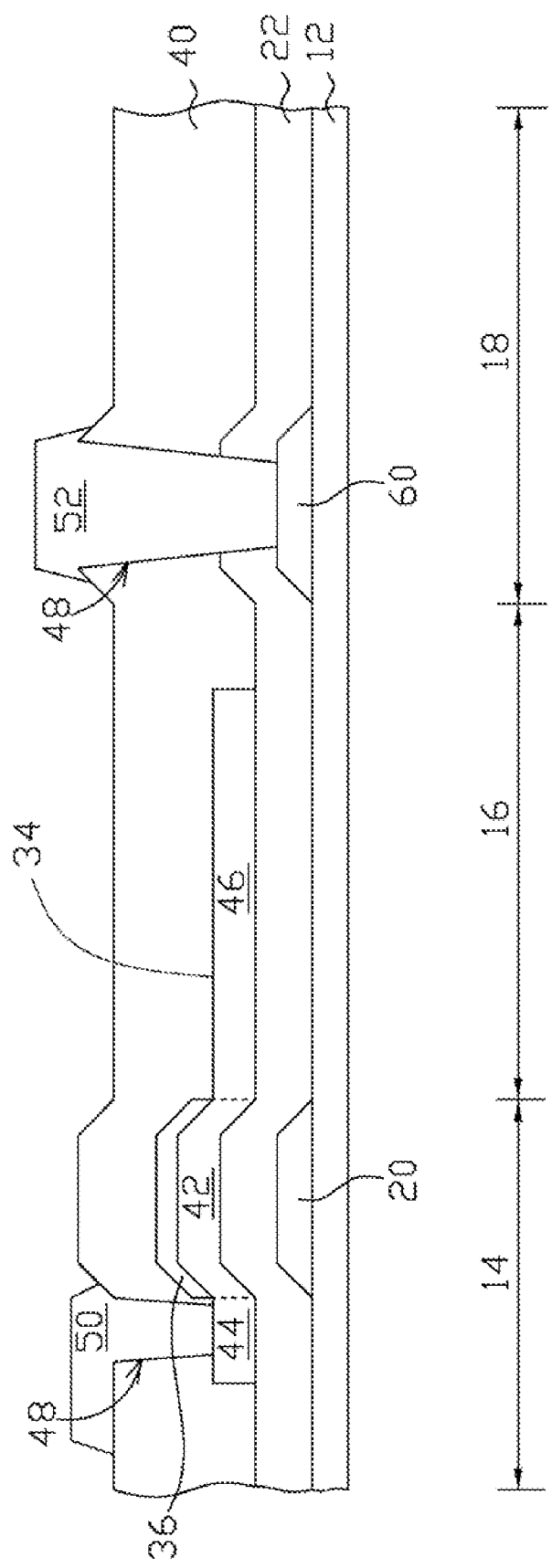
Figure 6:
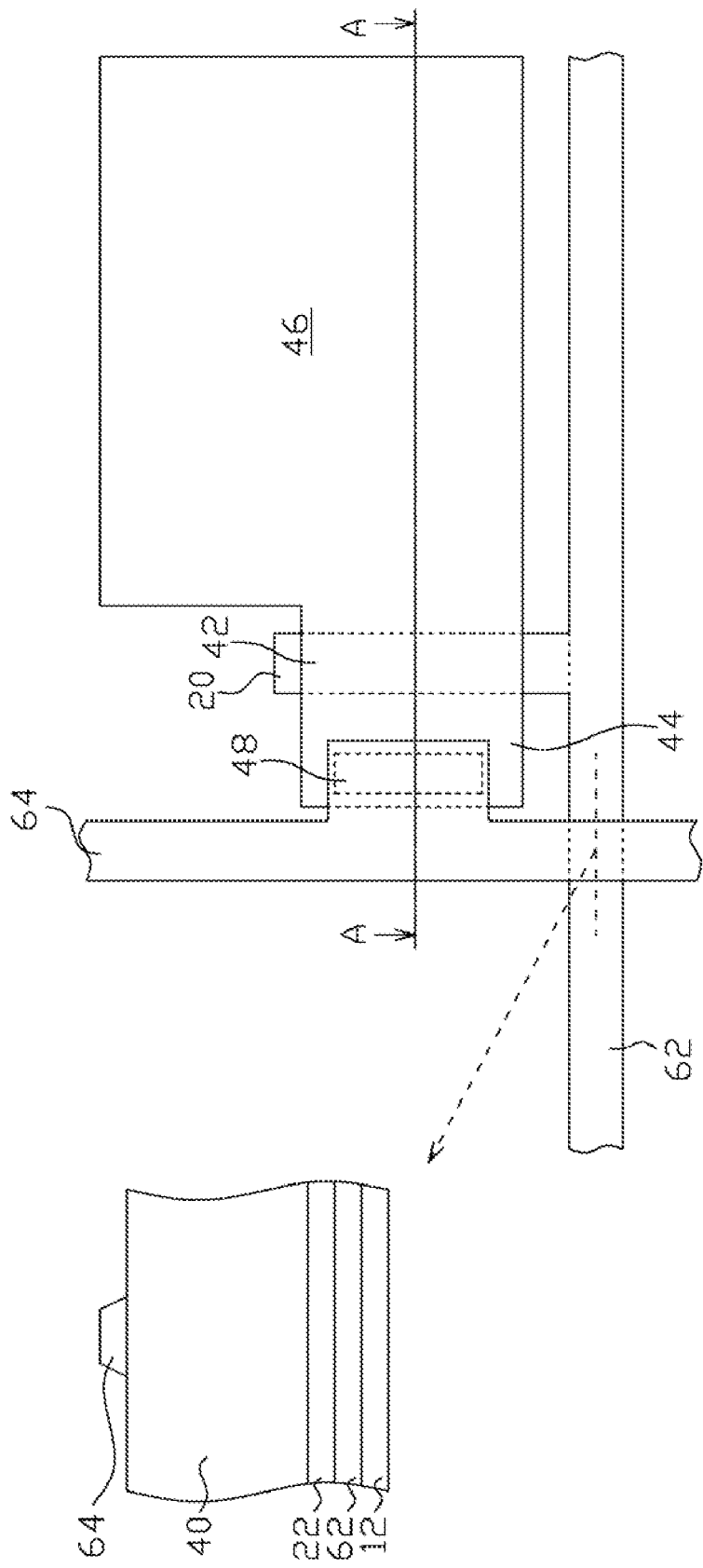
FIG. 6 is a schematic view of an intersection of a scan line and data line of the pixel structure of the FIG. 5.

Referring to FIGS. 4 and 5, a plurality of contact holes 48 are defined in the second protective layer 40 by a photo-etching process. A metal layer (not shown) is formed on the second protective layer 40 and filled in the contact holes 48. The metal layer may be made of material such as tungsten, molybdenum, tungsten and molybdenum alloys, and aluminum and titanium alloy. A conductor 50 is formed in the contact hole 48 in the transistor region 14 and on the second protective layer 40 in the transistor region 14, and another conductor 52 is formed in the contact holes 48 in the conductor region 18 and on the second protective layer 40 in the conductor region 18 by a photo-etching process. A heat treatment process such as a thermal annealing process is performed. Referring to FIG. 6, the conductors 50 and 52 form a conductor structure (not labeled) at the intersection of the scan line 62 and data line 64. The scan line 62 includes a protrusion served as the gate electrode 20.

In this embodiment, the manufacturing process of forming and defining the contact hole 48, and the conductors 50 and 52 may includes following steps:

A second patterned photo-resist layer 54 having different thickness is formed on the second protective layer 40 by using a half-stone mask, and defines a contact hole region in the second protective layer 40, such as a contact hole region 48 shown in FIG. 6. The second patterned photo-resist layer 54 includes a third portion 58 disposed on the second protective layer 40 of the data line 64 and a forth portion 56 disposed on the second protective layer 40 outside of the contact hole region and the data line 64. The thickness of the forth portion 56 is thicker than that of the third portion 58.

The second protective layer 40 is removed by an etching process such as a dry etching process or a wet etching process by using the second patterned photo-resist layer 54 as a shield to define a plurality of contact holes 48. After that, the thickness of the second patterned photo-resist layer 54 is decreased, and an ashing process removes the third portion 58 of the second patterned photo-resist layer 54. In addition, a metal layer (not shown) is deposited in the contact holes 48, and on the second protective 40 and the second pattern photo-resist layer 54.

The second pattern photo-resist layer 54 and part of the metal layer disposed on the second pattern photo resist layer 54 are removed by stripping. The conductors 50 and 52 are respectively formed in the transistor region 14 and the conductor region 18, and a data line 64 is also formed on the second protective layer 40 by a heat treatment process such as a thermal annealing process. In this embodiment, only one half-tone mask is needed to pattern the second protective layer 40 and the metal layer, to define the contact holes 48 and form the conductors 50 and 52, and data line 64.

Figure 7:
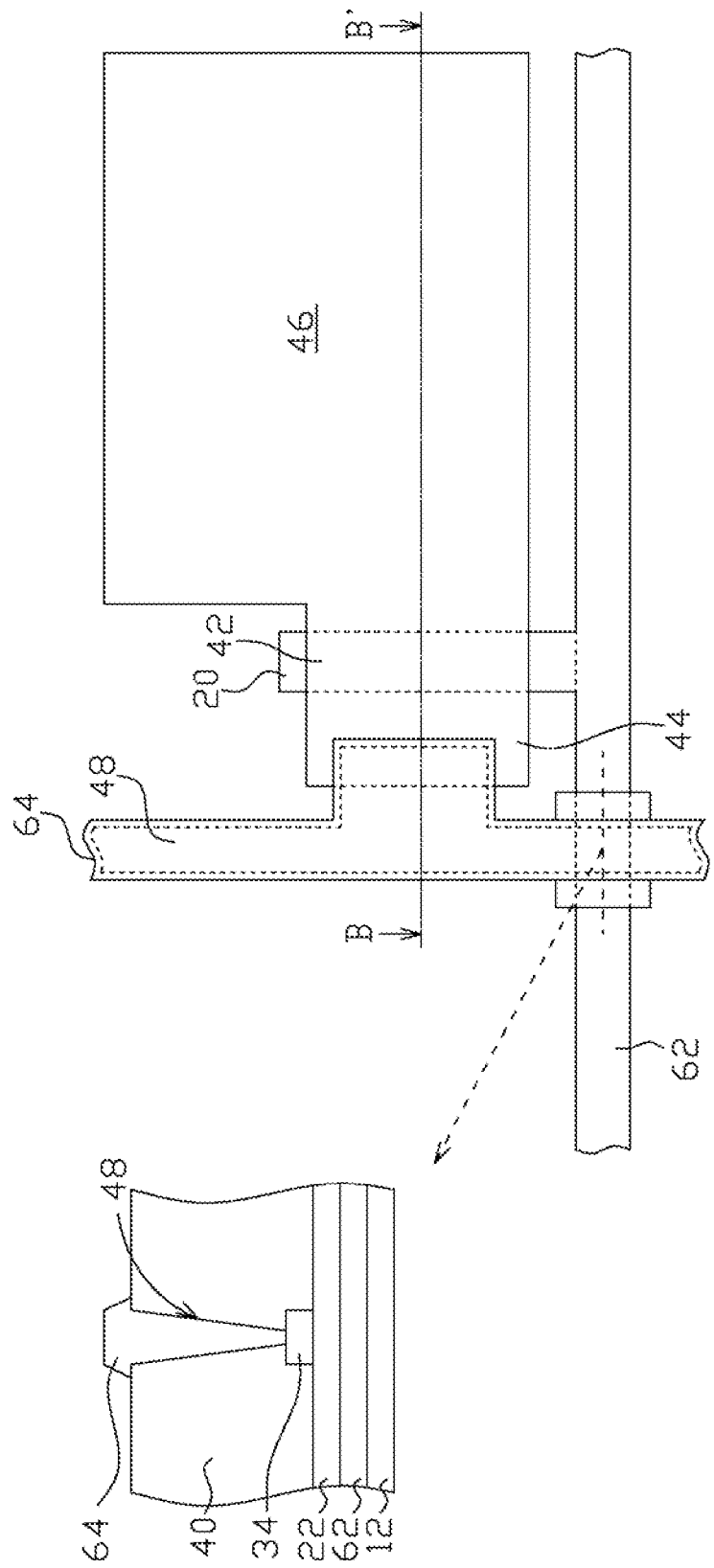
FIG. 7 is a schematic view of an intersection of a scan line and data line of a pixel structure, according to another embodiment.

Referring to FIG. 7, another conductor structure is formed at the intercross of the scan line 62 and the data line 64, according to another embodiment.

Figure 8:
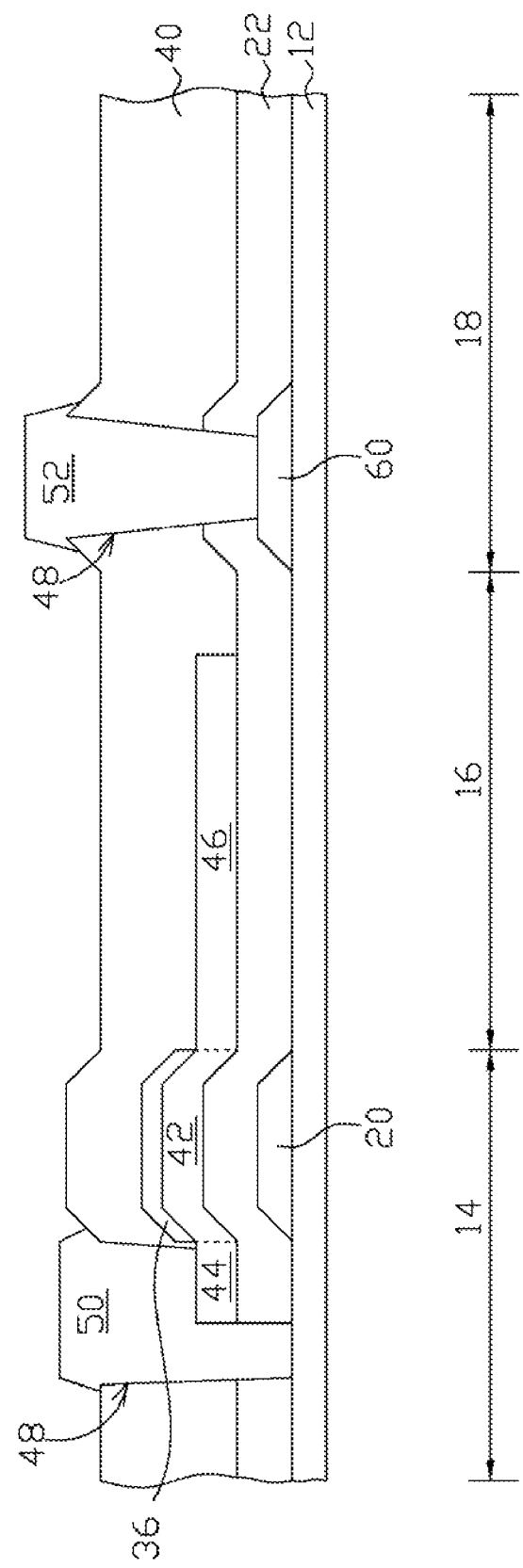
FIG. 8 is a cross-sectional view taken along line BB' of the FIG. 7.

Referring to FIG. 8, in this embodiment, the second protective layer 40 and the metal layer are patterned by using a common mask, which, form the contact holes 48, the conductors 50 and 52, and data line 64, and also forms a conductor structure buried in the second protective layer 40. For example, first, a patterned photo-resist layer (not shown) is formed on the second protective layer 40 using a common mask. The second protective layer 40 of the transistor region 14, the second protective layer 40 of contact hole region, shown as the contact hole region 48 in the FIG. 7. A portion of the insulating layer 22 is removed to define a plurality of the contact holes 48 by an etching process, such as a dry etching process or a wet etching process, by using the patterned photo-resist layer as a shield.

A metal layer (not shown) is deposited in the contact holes 48 and the patterned photo-resist layer, and the patterned photo-resist layer and part of the metal layer disposed on the patterned photo-resist layer are removed together by a stripping process. The conductors 50 and 52 are respectively formed in the transistor region 14 and the conductor region 18, and a data line 64 is formed on the second protective layer 40 by a heat treatment process such as a thermal annealing process.

In this exemplary embodiment, a doped patterned semi-conductive layer 34 is disposed between the data line 64 and the insulating layer 22 at the intersection of the scan line 62 and the data line 64. However, in other embodiments, a patterned semi-conductive layer 34 can replace the doped patterned semi-conductive layer 34.

Referring to FIG. 5, a pixel structure (not labeled) according to one embodiment of the present disclosure includes, a substrate 12 defining a transistor region 14, a pixel region 16, and a conductive region 18. At least one gate electrode 20 is disposed on the transistor region 14 of the substrate 12, an insulating layer 22 is disposed on the gate electrode 20 and the substrate 12, a patterned semi-conductive layer 34 is disposed on the transistor region 14 and the gate region 16 of the insulating layer 22. A patterned first protective layer 36 is disposed on the patterned semi-conductive layer 34 of the transistor region 14 and a second protective layer 40 is disposed on the patterned first protective layer 36, the patterned semi-conductive layer 34, and the insulating layer 22. The pattern semi-conductive layer 34 is made of InGaZnO. The patterned first protective layer 36 is made of monox. The second protective layer 40 is made of silicon nitride. A channel 42 of a TFT is defined in the patterned semi-conductive layer 34 overlaid by the patterned first protective layer 36. The channel 42 is a semi-conductive layer without being doped. A portion of the patterned semi-conductive layer 34 in the transistor region 14 and the doped pixel region 16 is served as a source and a pixel electrode of the TFT.

The pixel structure includes transparent semi-conductive material made of InGaZnO replacing a conventional amorphous silicon and ITO materials to form the channel and the pixel electrode of a TFT, and rises the chargeable ability and reduces leakage of the TFT by using the semi-conductive material. In addition, the method for manufacturing the pixel structure forms the channel and the pixel electrode only by a photo-etching process, and do not need to respectively form the channel and the pixel electrode from amorphous silicon and ITO materials. Meanwhile, the method for manufacturing the pixel structure only needs the three-mask process to form the pixel structure by using the half-tone mask and the process of manufacturing pixel structure is simple. The transparent semi-conductive material made of InGaZnO can form a storage capacitor with members such as the gate insulating layer and the gate electrode to improve the capacity of storage, and advances the efficiency of a panel.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for manufacturing a pixel structure, comprising:
    providing a substrate including a transistor region and a pixel region;
    forming at least one gate electrode on the transistor region of the substrate;
    forming an insulating layer on the substrate to overlay the gate electrode;
    forming a patterned semi-conductive layer located on the transistor region and the pixel region of the surface of the insulating layer;
    forming a patterned first protective layer on a portion of the patterned semi-conductive layer corresponding to the gate electrode; and
    doping the patterned semi-conductive layer without being overlaid by the patterned first protective layer, wherein the doped semi-conductive layer serves as a source electrode and a pixel electrode, and the patterned semi-conductive layer overlaid by the patterned first protective layer serves as a channel between the source electrode and the pixel electrode.

2. The method for manufacturing a pixel structure as claimed in claim 1, wherein the patterned semi-conductive layer includes indium gallium zinc oxide.

3. The method for manufacturing a pixel structure as claimed in claim 1, wherein the step of doping the patterned semi-conductive layer without being overlaid by the patterned first protective layer includes:
    forming a second protective layer to overlay the first protective layer, the semi-conductive layer, and the insulating layer via a chemical vapor deposition process; and
    importing gas having hydrogen atoms during the chemical vapor deposition process and implanting the hydrogen atoms to the patterned semi-conductive without being overlaid by the patterned first protective layer.

4. The method for manufacturing a pixel structure as claimed in claim 1, wherein the step of forming a patterned semi-conductive layer on the transistor region and the pixel region includes:
    forming a semi-conductive layer on the insulating layer;
    overlaying a first protective layer on the semi-conductive layer;
    forming a first patterned photo-resist layer having different thickness on the first protective layer, wherein the first patterned photo-resist layer including a first portion corresponding to the transistor region, a second portion corresponding to the pixel region, and the thickness of the first portion is thicker than that of the second portion;
    removing the first protective layer and partially removing the semi-conductive layer outside of the transistor region and the pixel region to form the patterned semi-conductive layer from a remaining semi-conductive layer by using the first patterned photo-resist layer;
    removing the second portion of the first photo-resist layer disposed on pixel region;
    removing the first protective layer outside of the transistor region to form the patterned first protective layer by using the first portion of the first patterned photo-resist layer disposed on the transistor region, and defining a channel region in the patterned semi-conductive layer disposed on the transistor region; and
    substantially removing a remaining first patterned photo-resist layer.

5. The method for manufacturing a pixel structure as claimed in claim 4, wherein the first patterned photo-resist layer is formed by using a half-tone mask.

6. The method for manufacturing a pixel structure as claimed in claim 3, wherein the method further includes following steps after forming a doped semi-conductive layer:
    forming a second patterned photo-resist layer having different thickness on the second protective layer, and defining a contact hole region in the second protective layer, wherein the second patterned photo-resist layer includes a third portion disposed on the second protective layer of a data line, a forth portion disposed on the second protective layer outside of the contact hole region and the data line, and the thickness of the forth portion is thicker than that of the third portion;
    removing a part of the second protective layer and the insulating layer to form a plurality of contact hole by using the second patterned photo-resist layer;
    removing the third portion of the second patterned photo-resist layer;
    forming a metal layer in the contact hole, and on the second protective and the second pattern photo-resist layer;
    removing the second pattern photo-resist layer and a part of the metal layer disposed on the second pattern photo resist layer; and
    performing a heat treatment.

* * * * *